United States Patent
Oh et al.

(10) Patent No.: US 10,217,651 B2
(45) Date of Patent: Feb. 26, 2019

(54) WASHING DEVICE

(71) Applicant: LG DISPLAY CO., LTD., Seoul (KR)

(72) Inventors: Tae Young Oh, Paju-si (KR); Eun Ha Lee, Paju-si (KR)

(73) Assignee: LG Display Co., Ltd., Seoul (KR)

(*) Notice: Subject to any disclaimer, the term of this patent is extended or adjusted under 35 U.S.C. 154(b) by 234 days.

(21) Appl. No.: 14/668,597

(22) Filed: Mar. 25, 2015

(65) Prior Publication Data

US 2015/0200115 A1  Jul. 16, 2015

Related U.S. Application Data

(62) Division of application No. 12/569,272, filed on Sep. 29, 2009, now Pat. No. 9,362,146.

(30) Foreign Application Priority Data

Nov. 14, 2008 (KR) .......................... 10-2008-113050

(51) Int. Cl.
- *H01L 21/67* (2006.01)
- *B08B 7/00* (2006.01)
(Continued)

(52) U.S. Cl.
CPC .......... *H01L 21/67034* (2013.01); *B08B 3/10* (2013.01); *B08B 7/0035* (2013.01);
(Continued)

(58) Field of Classification Search
CPC .......... H01L 21/67706; H01L 21/6784; B65G 53/04; B65G 49/06; B65G 49/065; B08B 5/02
(Continued)

(56) References Cited

U.S. PATENT DOCUMENTS

| 4,376,672 A | 3/1983 | Wang et al. |
| 4,575,408 A | 3/1986 | Bok |

(Continued)

FOREIGN PATENT DOCUMENTS

| JP | 4-83340 A | 3/1992 |
| JP | 2002-172369 | 6/2002 |

(Continued)

OTHER PUBLICATIONS

JPH04083340—Abstract, Mar. 1992.*

(Continued)

*Primary Examiner* — Marc Lorenzi

(74) *Attorney, Agent, or Firm* — Seed IP Law Group LLP

(57) ABSTRACT

A washing device is disclosed, which is capable of preventing damage of a substrate caused by drooping of the substrate. The washing device includes a plasma irradiating part supplied with a substrate from a substrate loading part to remove dirt from the substrate by irradiating plasma to the substrate; a dirt washing part supplied from the substrate from the plasma irradiating part to remove dirt remaining on the substrate; a finishing washing part supplied with the substrate from the dirt washing part to wash the substrate; a drying part supplied with the substrate from the finishing washing part to dry the substrate; and a substrate unloading part supplied with the substrate from the drying part to unload the substrate, wherein the plasma irradiating part includes a plasma irradiation unit that irradiates plasma to the substrate and a floating unit that maintains the substrate in a floating state.

11 Claims, 4 Drawing Sheets

(51) Int. Cl.
*H01L 21/677* (2006.01)
*H01L 21/683* (2006.01)
*B08B 3/10* (2006.01)
*G02F 1/13* (2006.01)

(52) U.S. Cl.
CPC .. *H01L 21/67028* (2013.01); *H01L 21/67051* (2013.01); *H01L 21/6776* (2013.01); *H01L 21/67115* (2013.01); *H01L 21/6838* (2013.01); *G02F 2001/1316* (2013.01)

(58) Field of Classification Search
USPC ..................................................... 134/115 R
See application file for complete search history.

(56) References Cited

U.S. PATENT DOCUMENTS

| | | | |
|---|---|---|---|
| 6,365,531 | B1 | 4/2002 | Hayashi et al. |
| 2002/0000019 | A1 | 1/2002 | Park et al. |
| 2004/0069320 | A1 | 4/2004 | Bergman |
| 2005/0037628 | A1 | 2/2005 | Ohsawa et al. |
| 2005/0241678 | A1 | 11/2005 | Mori |
| 2007/0034228 | A1 | 2/2007 | Devitt |
| 2007/0095476 | A1 | 5/2007 | Seeki et al. |
| 2007/0221253 | A1 | 9/2007 | Nishikido |

FOREIGN PATENT DOCUMENTS

| | | | |
|---|---|---|---|
| JP | 2002-176091 | | 6/2002 |
| JP | 2003-63643 | | 3/2003 |
| JP | 2006210393 A | * | 8/2006 |
| JP | 2006-324510 | | 11/2006 |
| JP | 2007-246274 | | 9/2007 |
| JP | 2008166359 A | * | 7/2008 |
| TW | I232838 | | 5/2005 |
| TW | I244673 | | 12/2005 |
| TW | 200610592 | | 4/2006 |

OTHER PUBLICATIONS

JP2003063643—Machine Translation, Mar. 2003.*
JP2007246274—Machine Translation, Sep. 2007.*
JP2008166359—Machine Translation (Year: 2008).*
JP2006210393—Machine Translation (Year: 2006).*
Office Action issued in corresponding Japanese Patent Application No. 2009-256815, dated Oct. 24, 2011.
Office Action issued in corresponding Taiwan Patent Application No. 098128312, dated Sep. 13, 2012.

* cited by examiner

FIG. 4
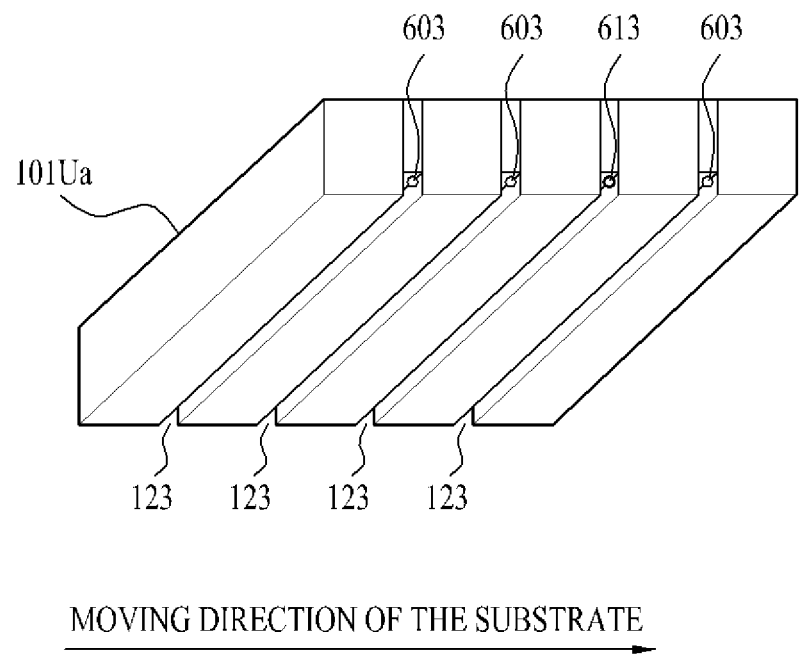
MOVING DIRECTION OF THE SUBSTRATE
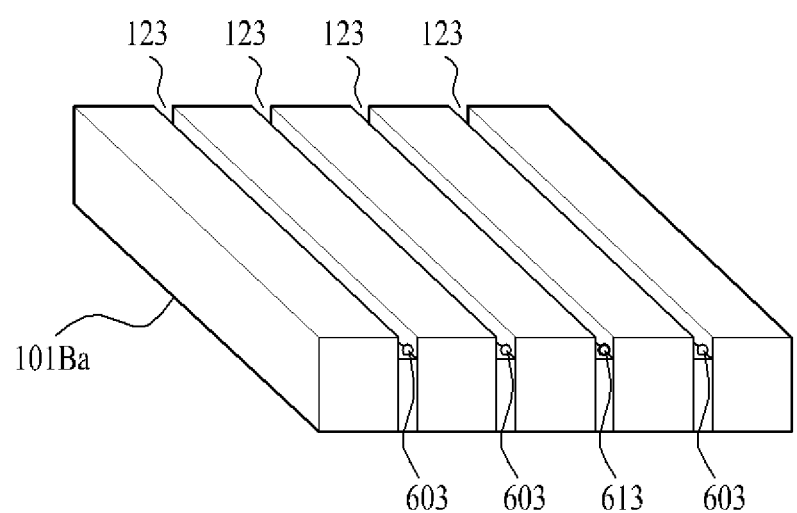

WASHING DEVICE

The present patent document is a divisional of U.S. patent application Ser. No. 12/569,272, filed on Sep. 29, 2009, which claims the benefit of Korea Patent Application No. 10-2008-113050 filed on Nov. 14, 2008, the entire contents of which is incorporated herein by reference for all purposes as if fully set forth herein.

BACKGROUND

Field of the Invention

The present disclosure relates to a washing device, and more particularly, to a washing device capable of preventing damage of a substrate caused by drooping of the substrate during plasma irradiation.

Discussion of the Related Art

A liquid crystal display (LCD) device displays images by controlling optical transmittance of liquid crystal cells in accordance with video signals. An active-matrix-type LCD is advantageous in displaying a moving picture since every pixel cell is equipped with a switching element. Generally, a thin film transistor (TFT) has been used for the switching element.

The LCD comprises a pair of substrates facing each other, and a liquid crystal layer interposed between the substrates. One of the substrates is provided with a TFT such as the switching element whereas the other one substrate with a color filter. Before and after those processes, the substrates are subject to a washing process.

In the washing process, the substrates are transferred to relevant devices through transfer rollers. However, as size of the substrate increases, length of the transfer roller should accordingly increase, thereby causing the middle part of a central axis of the transfer roller to droop in a direction of gravity by its own weight. Therefore, the middle part of the substrate placed on the transfer roller would also droop in the gravity direction. Consequently, the substrate may be damaged.

BRIEF SUMMARY

A washing device includes a plasma irradiating part supplied with a substrate from a substrate loading part to remove dirt from the substrate by irradiating plasma to the substrate; a dirt washing part supplied from the substrate from the plasma irradiating part to remove dirt remaining on the substrate; a finishing washing part supplied with the substrate from the dirt washing part to wash the substrate; a drying part supplied with the substrate from the finishing washing part to dry the substrate; and a substrate unloading part supplied with the substrate from the drying part to unload the substrate, wherein the plasma irradiating part includes a plasma irradiation unit that irradiates plasma to the substrate and a floating unit that maintains the substrate in a floating state.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle of the invention. In the drawings:

FIG. 4 is a view illustrating the rear side of an upper dirt washing part and a lower dirt washing part of the washing device.

DETAILED DESCRIPTION OF THE DRAWINGS AND THE PRESENTLY PREFERRED EMBODIMENTS

Reference will now be made in detail to the preferred embodiments, examples of which are illustrated in the accompanying drawings. Wherever possible, the same reference numbers will be used throughout the drawings to refer to the same or like parts.

Figure 1:
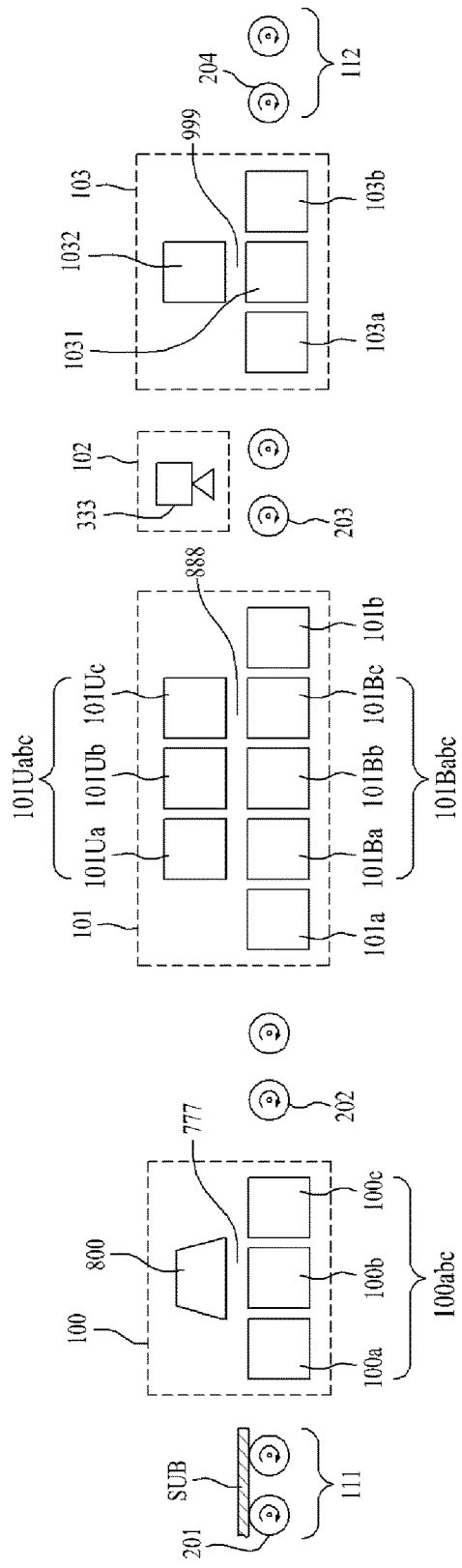
FIG. 1 is a washing device according to an embodiment of the present disclosure.

FIG. 1 shows a washing device according to an embodiment of the present disclosure.

Referring to FIG. 1, the washing device comprises a plasma irradiating part 100, a dirt washing part 101, a finishing washing part 102, a drying part 103, and a substrate unloading part 112. The plasma irradiating part 100 is supplied with a substrate SUB from a substrate loading part 111 and removes dirt from the substrate SUB by irradiating plasma to the substrate SUB. The dirt washing part 101 is supplied with the substrate SUB from the plasma irradiating part 100 and washes off dirt remaining on the substrate SUB. The finishing washing part 102 is supplied with the substrate SUB from the dirt washing part 101 and washes the substrate SUB. The drying part 103 is supplied with the substrate SUB and dries the substrate SUB. The substrate unloading part 112 is supplied with the substrate SUB from the drying part 103 and unloads the substrate SUB. Here, the plasma irradiating part 100 comprises a plasma irradiation unit 800 that irradiates plasma to the substrate SUB, and a floating unit that maintains the substrate SUB in a floating state.

A plurality of transfer rollers are provided among the above respective parts to transfer the substrate SUB. The transfer rollers are also provided to the substrate loading part 111 and the substrate unloading part 112.

The substrate loading part 111 is equipped with a first transfer roller 201 for transferring the substrate SUB to the plasma irradiating part 100. A second transfer roller 202 is mounted between the plasma irradiating part 100 and the dirt washing part 101 to transfer the substrate SUB to the dirt washing part 101. A third transfer roller 203 is mounted between the dirt washing part 101 and the drying part 103 to transfer the substrate SUB from the dirt washing part 101 to the drying part 103. A fourth transfer roller 204 is mounted to the substrate unloading part 112 to transfer the substrate SUB from the drying part 103 to the outside. The finishing washing part 102 is disposed above the third transfer roller 203, including a washing unit 333 that jets a detergent solution toward the substrate SUB placed on the third transfer roller 203.

Hereinafter, the above component parts will be explained in greater detail with reference to FIG. 1 through FIG. 3.

Figure 2:
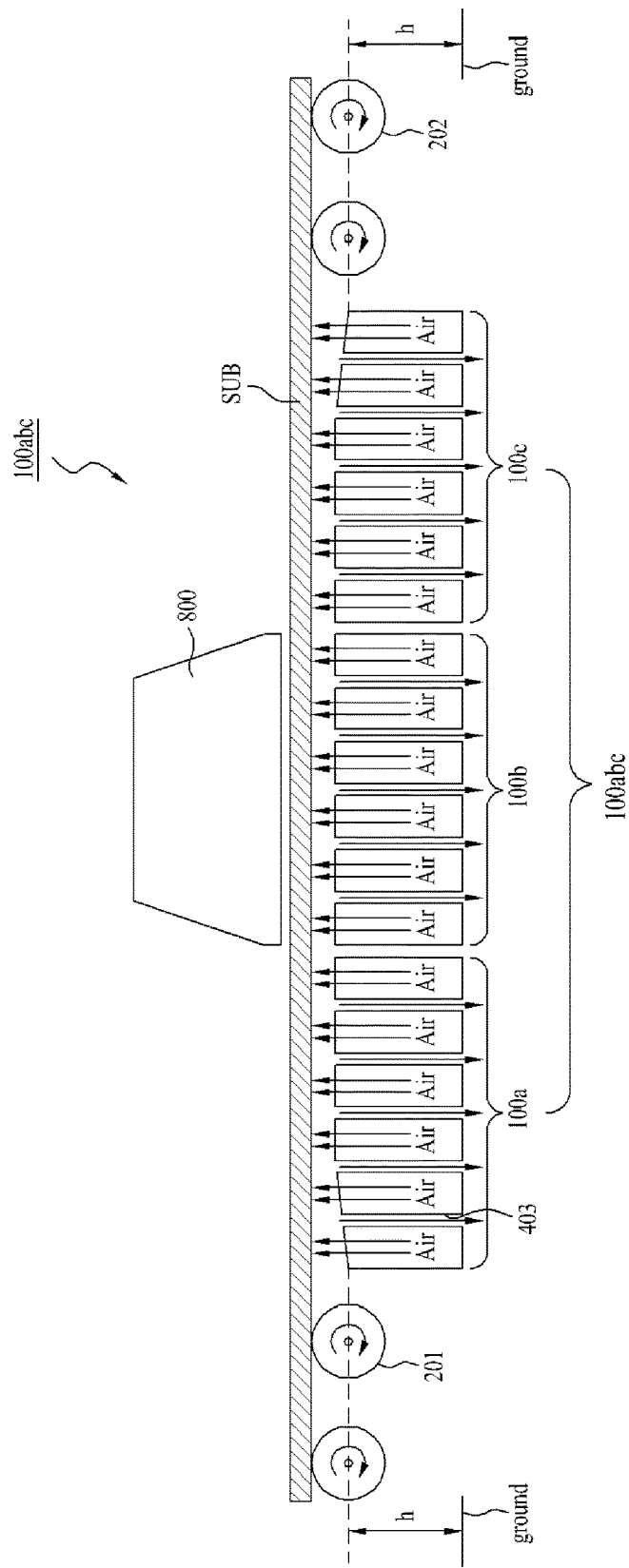
FIG. 2 is a detailed structure view of a plasma irradiating part of the washing device of FIG. 1.
Figure 3:
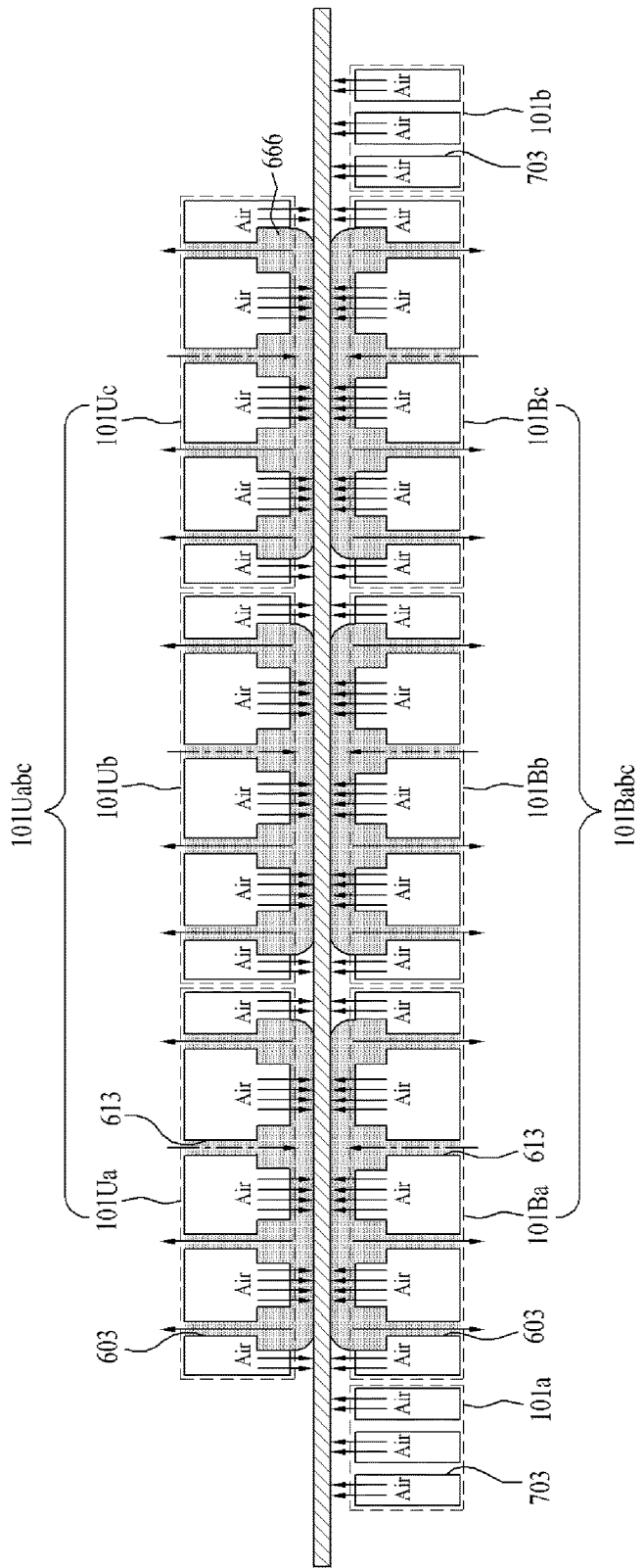
FIG. 3 is a detailed structure view of a washing part of the washing device of FIG. 1.

FIG. 2 is a detailed view of the plasma irradiating part 100 of FIG. 1 and FIG. 3 is a detailed view of the dirt washing part 101 of FIG. 1.

Plasma Irradiating Part 100

Referring to FIG. 1 and FIG. 2, the plasma irradiating part 100 comprises the plasma irradiation unit 800 that irradiates plasma onto the substrate SUB, and the floating unit 100*abc* that maintains the substrate SUB in a floating state.

The plasma irradiation unit 800 irradiates plasma on the substrate SUB to burn out dirt, especially organic substances, formed on the substrate SUB, thereby removing the dirt.

The plasma irradiation unit 800 and the floating unit 100*abc* are facing each other, being distanced by a predetermined interval. The substrate SUB is transferred through a transfer space 777 formed between the plasma irradiation unit 800 and the floating unit 100*abc*.

The floating unit 100*abc* jets air toward the transfer space 777 and draws in the jetted air simultaneously, thereby maintaining a floating state of the substrate SUB.

The floating unit 100*abc* may be divided into a first to a third floating units 100*a*, 100*b* and 100*c*, however, the number of the floating units is not limited to three as in this embodiment. That is, the floating unit 100*abc* may comprise two or more than four units. For convenience of explanation, the floating unit 100*abc* will be explained to comprise three floating units in this embodiment.

The second floating unit 100*b* is disposed between the first and the third floating units 100*a* and 100*c* so as to face the plasma irradiation unit 800. As shown in FIG. 2, especially, the first and third floating units 100*a* and 100*c* are slanted at one surface thereof directed to the substrate SUB being transferred. To be more specific, the first floating units 100*a* disposed adjacent to the first transfer roller 201 are slanted by one surface thereof to be gradually lowered toward the first transfer roller 201. Also, the third floating unit 100*c* disposed adjacent to the second transfer roller 202 are slanted by one surface thereof to be gradually lowered toward the second transfer roller 202.

As shown in FIG. 2, a distance h from a lowermost position among the slanted surfaces of the first floating units 100*a* to the ground is equal to a distance h from a central axis of the first transfer roller 201 to the ground. Also, a distance h from a lowermost position among the slanted surfaces of the third floating units 100*c* to the ground is equal to a distance h from a central axis of the second transfer roller to the ground.

The first to the third floating units 100*a* to 100*c* are made of a porous material so that the air supplied from the outside can be jetted to the substrate SUB passing through the first to the third floating units 100*a* to 100*c*. In other words, the air jetted from the outside toward upper parts of the first to the third floating units 100*a* to 100*c* is passed through the first to the third floating units 100*a* to 100*c* and thereby supplied to the transfer space 777.

The first to the third floating units 100*a* to 100*c* each include a plurality of suction holes 403 for drawing the air from the transfer space 777. The suction holes 403 are directed to the transfer space 777 by penetrating the first to the third floating units 100*a* to 100*c*.

Thus, by existence of the first to the third floating units 100*a* to 100*c* formed under the plasma irradiation unit 800, drooping of the substrate SUB can be prevented during the plasma irradiation.

Dirt Washing Part 101

As shown in FIG. 1 and FIG. 3, the dirt washing part 101 comprises an upper dirt washing unit 101U*abc* and a lower dirt washing unit 101B*abc* which are facing each other, being distanced by a predetermined interval. Therefore, a transfer space 888 for the substrate SUB is formed between the two distanced structures 101U*abc* and 101B*abc*.

The upper dirt washing unit 101U*abc* jets air toward the transfer space 888 and draws the jetted air simultaneously. Likewise, the lower dirt washing unit 101B*abc* jets air toward the transfer space 888 and draws in the jetted air simultaneously. Accordingly, the substrate SUB in the transfer space 888 can be maintained in a floating state. In other words, since the upper dirt washing unit 101U*abc* jets the air toward an upper surface of the substrate SUB introduced in the transfer space 888 while drawing back the jetted air and the lower dirt washing unit 101B*abc* jets the air toward a lower surface of the substrate SUB introduced in the transfer space 888 while drawing back the jetted air, the substrate SUB can be maintained in the floating state in the transfer space 888. Here, the jetting force operates stronger than the suction force.

By jetting a detergent solution 666 to the transfer space 888, the upper dirt washing unit 101U*abc* generates foam with the detergent solution 666 and the jetted air. Therefore, dirt formed at the upper surface of the substrate SUB passing through the transfer space 888 can be removed. Additionally, the lower dirt washing unit 101B*abc* jets the detergent solution 666 to the transfer space 888, thereby generating foam with the detergent solution 666 and the jetted air. Accordingly, dirt formed at the lower surface of the substrate SUB passing through the transfer space 888 can be removed. Furthermore, the upper and the lower dirt washing units 101U*abc* and 101B*abc* discharge the detergent solution 666 to the outside using the air being drawn. Here, deionized water, a chemical solution or a mixture of the deionized water and the chemical solution may be used for the detergent solution 666.

The upper and the lower dirt washing units 101U*abc* and 101B*abc* are made of a porous material so that the air supplied from the outside can be jetted to the transfer space 888 by passing through the upper and the lower dirt washing units 101U*abc* and 101B*abc*. In other words, the air jetted from the outside toward an upper part of the upper dirt washing unit 101U*abc* is supplied to the transfer space 888 by passing through the upper dirt washing unit 101U*abc*, while the air jetted from the outside toward a lower part of the lower dirt washing unit B*abc* is supplied to the transfer space 888 by passing through the lower dirt washing unit 101B*abc*.

A plurality of suction holes 603 for drawing the air are formed respectively at the upper and the lower dirt washing units 101U*abc* and 101B*abc*. The suction holes 603 of the upper dirt washing unit 101U*abc* are directed to the transfer space 888, being formed through the upper dirt washing unit 101U*abc*. The suction holes 603 of the lower dirt washing unit 101B*abc* are directed to the transfer space 888, being formed through the lower dirt washing unit 101B*abc*.

In addition, the upper and the lower dirt washing units 101U*abc* and 101B*abc* respectively include a plurality of jet holes 613 for jetting the detergent solution 666 to the transfer space 888. More specifically, the jet holes 613 of the upper dirt washing unit 101U*abc* are directed to the transfer space 888, being formed through the upper dirt washing unit 101U*abc*. On the other hand, the jet holes 613 of the lower dirt washing unit 101B*abc* are directed to the transfer space 888, being formed through the lower dirt washing unit 101B*abc*.

The upper dirt washing unit 101U*abc* may be divided into first to third upper dirt washing units 101U*a*, 101U*b* and 101U*c*. This is only by way of example, that is, the number of the upper dirt washing units is not limited to three.

Therefore, the upper dirt washing unit 101Uabc may comprise two or more than four units. Also, the lower dirt washing unit 101Babc may be divided into first to third lower dirt washing units 101Ba, 101Bb and 101Bc. In the same manner, the number of the lower dirt washing units 101Babc may be two or more than four. The first, second and third upper dirt washing units 101Ua, 101Ub and 101Uc face the first, second and third lower dirt washing units 101Ba, 101Bb and 101Bc, respectively.

FIG. 4 is a rear view of the first upper and lower dirt washing units 101Ua and 101Ba. Referring to FIG. 4, the first upper dirt washing unit 101Ua and the first lower dirt washing unit 101Ba further comprise a plurality of trenches 123, respectively. The plurality of suction holes 603 are commonly connected to any one of the trenches 123, thereby being able to draw in the air or the detergent solution 666 through the trench 123. In addition, the plurality of jet holes 613 are commonly connected to another one of the trenches 123, thereby being able to jet the detergent solution 666 to the transfer space 888 through the trench 123.

The trenches 123 are extended vertically to an advancing direction of the substrate SUB and arranged along the substrate advancing direction. Since the trenches 123 are filled with the detergent solution 666, the washing efficiency of the substrate SUB can be enhanced.

The first to the third upper dirt washing units 101Ua, 101Ub and 101Uc are distanced by about 20 μm from the upper surface of the substrate SUB. The first to the third lower dirt washing units 101Ba, 101Bb and 101Bc are distanced also by about 20 μm. The interval between the first to the third upper dirt washing units 101Ua, 101Ub and 101Uc and the first to the third lower dirt washing units 101Ba, 101Bb and 101Bc can be controlled according to the thickness of the substrate SUB.

Meanwhile, the dirt washing part 101 may further comprise first and second floating units 101a and 101b. The first floating unit 101 is disposed between the second transfer roller 202 and the first lower dirt washing unit 101Ba, and the second floating unit 101b is disposed between the third transfer roller 203 and the third lower dirt washing unit 101Bc.

The first and the second floating units 101a and 101b are made of a porous material so that the air supplied from the outside can be jetted to the substrate SUB through the first and the second floating units 101a and 101b. That is, the air jetted from the outside to upper parts of the first and the second floating units 101a and 101b is supplied to the transfer space 888 through the first and the second floating units 101a and 101b.

The first and the second floating units 101a and 101b may respectively comprise a plurality of suction holes 703 for drawing in the air from the transfer space 888.

Finishing Washing Part 102

The finishing washing part 102 comprises the washing unit 333 which is disposed above the third transfer roller 203 to jet the detergent solution 666 to the substrate SUB placed on the third transfer roller 203. The detergent solution 666 jetted from the washing unit 333 is supplied to the dirt washing part 101 and thereby recycled. In other words, the dirt washing part 101 recycles the detergent solution 666 once used in the washing unit 333.

By thus recycling the detergent solution 666 from the finishing washing part 102, waste of the detergent solution 666 can be reduced.

Drying Part 103

The drying part 103 comprises an upper drying unit 1032 and a lower drying unit 1031. The upper and the lower drying units 1032 and 1031 are at a predetermined interval from each other, thereby forming a transfer space 999 for the substrate SUB therebetween.

The upper drying unit 1032 jets air to the transfer space 999. More particularly, the upper drying unit 1032 jets air to the upper surface of the substrate SUB passing through the transfer space 999, thereby blowing away the detergent solution 666 remaining at the upper surface of the substrate SUB to the outside and drying the upper surface of the substrate SUB. In the same manner, the lower drying unit 1031 jets air to the transfer space 999. More particularly, the lower drying unit 1031 jets air to the lower surface of the substrate SUB, thereby blowing away the detergent solution 666 remaining at the lower surface of the substrate SUB to the outside and drying the lower surface of the substrate SUB.

The drying part 103 may further comprise first and second floating units 103a and 103b.

The first floating unit 103a is disposed between the third transfer roller 203 and a lower drying unit 1031 while the second floating unit 103b is disposed between the fourth transfer roller 112 and the lower drying unit 1031. The first and the second floating units 103a and 103b jet air upward and draw the jetted air back simultaneously, thereby maintaining the substrate SUB in a floating state.

The first and the second floating units 103a and 103b are made of a porous material so that the air supplied from the outside can be jetted to the substrate SUB by passing through the first and the second floating units 103a and 103b. Also, a plurality of suction holes are formed at the first and the second floating units 103a and 103b.

As apparent from the above description, the washing device according to the above-described embodiment of the present invention has the following advantages.

First, first to third floating units mounted to a lower part of a plasma irradiation unit are able to prevent drooping of a substrate in the gravity direction during a plasma irradiation process. Accordingly, damage of the substrate can be prevented during the plasma irradiation.

Second, since a detergent solution is recycled from a finishing washing part, waste of the detergent solution can be reduced.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

The invention claimed is:

1. A washing device comprising:
 a plasma irradiating cleaner having a plasma irradiating unit and an air jetting unit spaced apart from the plasma irradiating unit, and configured to receive a substrate, the plasma irradiating unit further configured to remove dirt from the substrate by irradiating the substrate with plasma, and the air jetting unit having a first plurality of air output nozzles positioned adjacent to the plasma irradiating unit, the plurality of first air output nozzles configured to jet air upward against the substrate with sufficient force to assist to support the substrate in the plasma irradiating cleaner and position the substrate spaced apart from the plurality of first air output nozzles while the substrate is within the plasma irradiating cleaner;
 a dirt washing assembly configured to receive the substrate from the plasma irradiating cleaner, having an upper dirt washing unit and a lower dirt washing unit separated by a space sized and dimensioned to receive the substrate and the upper and lower dirt washing units further configured to remove dirt remaining on the substrate, the upper and lower dirt washing units including a second plurality of air output nozzles positioned to jet air against the upper and lower surfaces of the substrate to assist to support the substrate in the dirt washing assembly and position the substrate spaced apart from the upper dirt washing unit and the lower dirt washing unit;
a finishing washing assembly configured to receive the substrate from the dirt washing assembly, and the finishing washing assembly further configured to wash the substrate;
a drying assembly configured to receive the substrate from the finishing washing assembly, and the drying assembly further configured to dry the substrate and to jet air upward against the substrate;
a substrate unloading assembly configured to receive the substrate from the drying assembly, and the substrate unloading assembly further configured to unload the substrate; and
a plurality of transfer rollers configured to transfer the substrate by applying a longitudinal force thereto, the plurality of transfer rollers comprising:
a first transfer roller mounted to transfer the substrate to the plasma irradiating cleaner, the first transfer roller being disposed outside the plasma irradiating cleaner;
a second transfer roller mounted between the plasma irradiating cleaner and the dirt washing assembly to transfer the substrate from the plasma irradiating cleaner to the dirt washing assembly, the second transfer roller being disposed outside the plasma irradiating cleaner;
a third transfer roller mounted between the dirt washing assembly and the drying assembly to transfer the substrate from the dirt washing assembly to the drying assembly; and
a fourth transfer roller mounted to the substrate unloading assembly to transfer the substrate from the drying assembly to the outside,
wherein the finishing washing assembly is disposed above the third transfer roller and there are no transfer rollers within the plasma irradiating cleaner or the dirt washing assembly.

2. The washing device according to claim 1, wherein the air jetting unit further includes a plurality of suction holes for drawing the air jetted by the air jetting unit in a direction opposite to a direction in which air is jetted from the air jetting unit towards the substrate.

3. The washing device according to claim 1, wherein the plasma irradiation unit and the air jetting unit facing to the plasma irradiation unit form a transfer space therebetween for the substrate to pass through, and wherein the air jetting unit is configured to jet air toward the transfer space and simultaneously draw the air jetted from the air jetting unit back, thereby maintaining the substrate in a supported state in which a portion of the substrate between the first transfer roller and the second transfer roller is prevented from drooping when the substrate is transferred across the transfer space by the first transfer roller and the second transfer roller.

4. The washing device according to claim 2, wherein the air jetting unit comprises first to third air jetting units disposed between the first transfer roller and the second transfer roller, wherein the first air jetting unit is adjacent to the first transfer roller, and a surface of the first air jetting unit is slanted to be lowered toward the first transfer roller,
the third air jetting unit is adjacent to the second transfer roller, and a surface of the third air jetting unit is slanted to be lowered toward the second transfer roller, and
the surfaces of the first and the third air jetting units are slanted away from the second air jetting unit.

5. The washing device according to claim 4, wherein a distance from a lowermost position among slanted surfaces of the first air jetting unit to the ground surface is equal to a distance from a central axis of the first transfer roller to a ground surface, and
a distance from a lowermost position among slanted surfaces of the third air jetting unit to the ground surface is equal to a distance from a central axis of the second transfer roller to the ground surface.

6. The washing device according to claim 1, wherein
the upper dirt washing unit jets air toward a transfer space between the upper dirt washing unit and the lower dirt washing unit and simultaneously draws in at least some of the air jetted from the upper dirt washing unit, and the lower dirt washing unit jets air toward the transfer space and simultaneously draws in at least some of the air jetted from the lower dirt washing unit.

7. The washing device according to claim 6, wherein the upper dirt washing unit jets a detergent solution to the transfer space and generates foam using the detergent solution and the air jetted from the upper dirt washing unit, thereby removing dirt formed at an upper surface of the substrate passing through the transfer space,
the lower dirt washing unit jets the detergent solution to the transfer space and generates foam using the detergent solution and the air jetted from the lower dirt washing unit, thereby removing dirt formed at an lower surface of the substrate passing through the transfer space, and
the upper and the lower dirt washing units discharge the detergent solution to the outside using the air being drawn.

8. The washing device according to claim 6, wherein the upper and the lower dirt washing units are made of a porous material so that the air supplied from the outside can be jetted to the transfer space by passing through the upper and the lower dirt washing units.

9. The washing device according to claim 6, wherein the dirt washing assembly further comprises:
a first dirt washing part air supplying unit disposed at one side of the second transfer roller; and
a second dirt washing part air supplying unit disposed at one side of the third transfer roller,
wherein the first and the second dirt washing part air supplying units jet air upward and simultaneously draw in at least some of the air jetted respectively from the first and the second dirt washing part air supplying units.

10. The washing device according to claim 1, wherein the drying assembly comprises:
a first air supplying unit disposed at one side of the third transfer roller; and
a second air supplying unit disposed at one side of the fourth transfer roller,
wherein the first and the second air supplying units jet the air upward and simultaneously draw in at least some of the air jetted respectively from the first and the second air supplying units.

11. The washing device of claim 1, wherein the upper and lower dirt washing units further include a plurality of air removal suction holes that remove the air jetted respectively from the upper and lower dirt washing units in a direction opposite to a direction in which the air is jetted respectively from the upper and lower dirt washing units towards the substrate.

* * * * *

UNITED STATES PATENT AND TRADEMARK OFFICE
CERTIFICATE OF CORRECTION

PATENT NO. : 10,217,651 B2  
APPLICATION NO. : 14/668597  
DATED : February 26, 2019  
INVENTOR(S) : Tae Young Oh et al.

Page 1 of 1

It is certified that error appears in the above-identified patent and that said Letters Patent is hereby corrected as shown below:

In the Claims

<u>Column 7, Line 54 Claim 3:</u>
"plasma irradiation unit and the air jetting unit facing to the" should read, -- plasma irradiation unit and the air jetting unit facing the --.

Signed and Sealed this  
Fourth Day of February, 2020

Andrei Iancu  
*Director of the United States Patent and Trademark Office*